United States Patent
Lou

(10) Patent No.: US 7,928,749 B2
(45) Date of Patent: Apr. 19, 2011

(54) VERTICAL PROBE COMPRISING SLOTS AND PROBE CARD FOR INTEGRATED CIRCUIT DEVICES USING THE SAME

(75) Inventor: Choon Leong Lou, Hsinchu (TW)

(73) Assignee: Star Technologies Inc., Hsinchu (TW)

( * ) Notice: Subject to any disclaimer, the term of this patent is extended or adjusted under 35 U.S.C. 154(b) by 0 days.

(21) Appl. No.: 12/724,046

(22) Filed: Mar. 15, 2010

(65) Prior Publication Data

US 2010/0171519 A1      Jul. 8, 2010

Related U.S. Application Data

(63) Continuation of application No. 12/237,698, filed on Sep. 25, 2008, now abandoned.

(30) Foreign Application Priority Data

Jun. 18, 2008  (TW) ............................... 97122644 A

(51) Int. Cl.
G01R 31/20      (2006.01)
(52) U.S. Cl. ............................ 324/754.03; 324/754.11
(58) Field of Classification Search .................. 324/754, 324/761
See application file for complete search history.

(56) References Cited

U.S. PATENT DOCUMENTS

| | | | | | |
|---|---|---|---|---|---|
| 3,611,128 | A | * | 10/1971 | Nagata | 324/72.5 |
| 4,035,723 | A | * | 7/1977 | Kvaternik | 324/754 |
| 4,116,523 | A | * | 9/1978 | Coberly et al. | 439/578 |
| 4,151,465 | A | * | 4/1979 | Lenz | 324/754 |
| 4,618,821 | A | * | 10/1986 | Lenz | 324/754 |
| 4,773,877 | A | * | 9/1988 | Kruger et al. | 439/482 |
| 4,973,903 | A | * | 11/1990 | Schemmel | 324/754 |
| 5,366,380 | A | * | 11/1994 | Reymond | 439/66 |
| 5,545,050 | A | * | 8/1996 | Sato et al. | 439/331 |
| 5,764,072 | A | * | 6/1998 | Kister | 324/754 |
| 6,023,171 | A | * | 2/2000 | Boyette et al. | 324/754 |
| 6,242,929 | B1 | * | 6/2001 | Mizuta | 324/754 |
| 6,300,783 | B1 | * | 10/2001 | Okubo et al. | 324/754 |
| 6,767,219 | B2 | * | 7/2004 | Maruyama et al. | 324/754 |

* cited by examiner

*Primary Examiner* — Ha Tran T Nguyen
*Assistant Examiner* — Richard Isla Rodas
(74) *Attorney, Agent, or Firm* — WPAT, P.C.; Anthony King

(57) ABSTRACT

A vertical probe comprises a linear body, a tip portion connected to one side of the linear body, and at least one slot positioned on the linear body. In particular, the vertical probe includes a depressed structure having a plurality of slots positioned on the linear body in parallel and on one side of the linear body. The present application also provides a probe card for integrated circuit devices comprising an upper guiding plate having a plurality of fastening holes, a bottom guiding plate having a plurality of guiding holes and a plurality of vertical probes positioned in the guiding holes. The vertical probe includes a linear body positioned in the guiding holes, a tip portion connected to one side of the linear body and at least one slot positioned on the linear body.

17 Claims, 5 Drawing Sheets

VERTICAL PROBE COMPRISING SLOTS AND PROBE CARD FOR INTEGRATED CIRCUIT DEVICES USING THE SAME

CROSS REFERENCE TO RELATED APPLICATIONS

This application is a continuing application of application Ser. No. 12/237,698, filed Sep. 25, 2008, which is incorporated herein in their entirety by reference.

BACKGROUND OF THE INVENTION (A) Field of the Invention

The present invention relates to a vertical probe and a probe card for integrated circuit devices using the same, and more particularly, to a vertical probe having a depressed structure providing vertical displacement for relieving the stress generated as the vertical probe contacts the device under test and a probe card for integrated circuit devices using the same.

(B) Description of the Related Art

Generally, it is necessary to test the electrical characteristics of integrated circuit devices on the wafer level to check whether the integrated circuit device satisfies the product specification. Integrated circuit devices with electrical characteristic satisfying the specification will be selected for the subsequent packaging process, and the other devices will be discarded to avoid additional packaging cost. Another electrical property test will be performed on the integrated circuit device after the packaging process is completed to screen out the below standard devices to increase the product yield.

There are two major types of probes according to the prior art, i.e., the cantilever probe and the vertical probe. The cantilever probe provides appropriate vertical displacement when the probe tip contacts an integrated circuit device under test via a cantilever contact structure designed to prevent the integrated circuit device under test from being exposed to excessive probe pressure applied by the probe tip. However, the cantilever contact structure occupies a larger planar space in a matrix array probing, which constrains the cantilever probe from being arranged in a fine pitch manner corresponding to an integrated circuit device with high-density of pins, therefore it cannot be applied to the testing of the integrated circuit devices with high-density of pins.

The vertical probe offers the vertical displacement required by the probe tip to contact the integrated circuit device under test using the deformation of the probe body itself, and can be arranged in a fine pitch manner corresponding to the integrated circuit devices under test with high-density of pin. However, if the deformation of the probe body is so large that adjacent probes may contact each other, this may cause short circuits or collisions.

U.S. Pat. No. 4,599,559 discloses a cantilever probe assembly for checking the electronic properties of integrated circuit devices. The cantilever probe is used to contact the pad of the device under test to build a path for propagating the test signal. However, the cantilever probe needs a space to receive the lateral cantilever, which limits the application of the cantilever probe to checking the electronic properties of integrated circuit devices with high-density pads.

U.S. Pat. No. 5,977,787 discloses a vertical probe assembly for checking the electronic properties of integrated circuit devices. The vertical probe assembly includes a buckling beam, an upper plate and a bottom plate. The vertical probe is used to contact the pad of the device under test to build a path for propagating the test signal, and bend itself to relieve the stress generated as the probe contacts the device under test. The upper plate and the bottom plate have holes to hold the buckling beam, and the hole of the upper plate deviates from the hole of the bottom plate, i.e., it is not positioned in a mirror image manner. In addition, frequent bending of the vertical probe is likely to generate metal fatigue and the lifetime of the vertical probe is thereby shortened.

U.S. Pat. No. 5,952,843 discloses a vertical probe assembly for checking the electronic properties of integrated circuit devices. The vertical probe assembly includes a bend beam, an upper plate and a bottom plate. The vertical probe has an S-shaped bend portion configured to relieve the stress generated as the probe contacts the device under test. In addition, the upper plate and the bottom plate have holes to hold the buckling beam, and the holes of the upper plate and the bottom plate are positioned in a mirror image manner, without deviation each other.

U.S. Pat. No. 6,476,626 discloses a probe contact system capable of adjusting distances between tips of the contactors and contact targets with a simple and low cost mechanism. The probe contact system uses a POGO pin to relieve the stress generated as the probe contacts the device under test. The POGO pin has a spring to relieve the stress so as to prevent the POGO pin from over-bending and generating metal fatigue.

U.S. Pat. No. 6,621,710 discloses a modular probe card assembly comprising a silicon substrate with probes modularly assembled on a main board. The silicon substrate has probes fabricated by the micro-electron-mechanical technique, which can fabricate the probe at very fine size and pitch. Consequently, the modular probe card assembly can be applied to integrated circuit devices with high-density pads

SUMMARY OF THE INVENTION

One aspect of the present invention provides a vertical probe and a probe card for integrated circuit devices using the same, the vertical probe having a depressed structure configured to provide vertical displacement to relieve the stress generated as the probe contacts the device under test.

A vertical probe according to this aspect of the present invention comprises a linear body, a tip portion connected to one side of the linear body, and at least one slot positioned on the linear body. In particular, the vertical probe includes a depressed structure having a plurality of slots positioned on the linear body in parallel and on one side of the linear body.

Another aspect of the present invention provides a probe card for integrated circuit devices comprising an upper guiding plate having a plurality of fastening holes, a bottom guiding plate having a plurality of guiding holes and a plurality of vertical probes positioned in the guiding holes. The vertical probe includes a linear body positioned in the guiding holes, a tip portion connected to one side of the linear body and at least one slot positioned in the linear body.

The conventional cantilever probe cannot be applied to integrated circuit devices with high-density pads since it requires a lateral space to receive the lateral cantilever. In contrast, the vertical probe of the present application does not need the lateral space, can provide variable contact force and can be applied to the integrated circuit devices with high-density pads of very small pitch. In addition, the conventional vertical probe uses the deformation of the probe body itself to provide the vertical displacement for relieving the stress generated as the probe contacts the device under test, but the adjacent probes may contact each other and cause short circuits or collisions if the deformation of the probe body is too large or there is minor misplacement of the probe body. In contrast, the vertical probe of the present application uses the slots to relieve the stress and the slots of the vertical probes can bend to the same side to prevent the vertical probes from contacting each other and causing short circuits or collisions.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
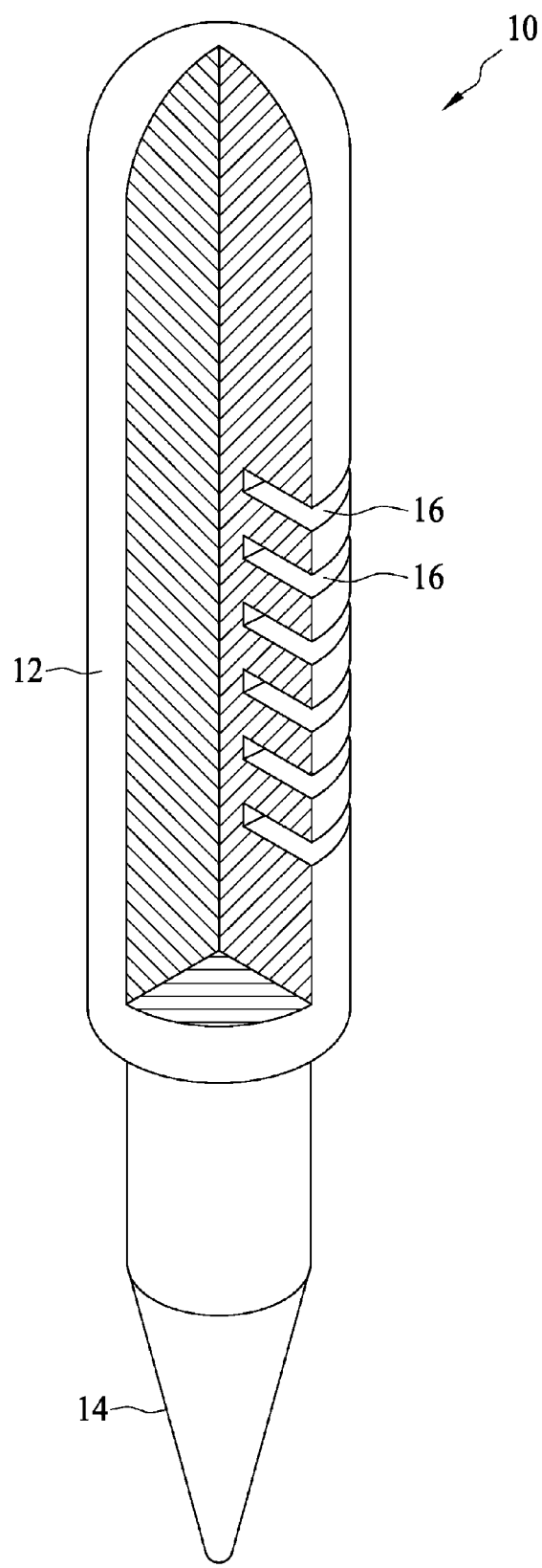
FIG. 1 illustrates a three-dimensional view of a vertical probe according to one embodiment of the present invention.

FIG. 1 illustrates a three-dimensional view of a vertical probe 10 according to one embodiment of the present invention. The vertical probe 10 comprises a linear body 12, a tip portion 14 connected to one side of the linear body 12, and a plurality of slots 16 positioned on the linear body 12. Specifically, the linear body 12 can extend along a direction substantially perpendicular to a device under test. The width of the tip portion 14 can be smaller than the width of the linear body 12. The plurality of slots 16 are configured to facilitate the bending of the linear body 12 when the vertical probe 10 is under compression and is configured to allow the linear body 12 to restore its unbent configuration when the vertical probe 10 is not under compression. Preferably, the linear body 12 is cylindrical, and the slots 16 are pie-shaped. In particular, the pie-shaped slots 16 are perpendicular to the surface of the linear body 12 and positioned on the linear body 12 in parallel such that the space of the pie-shaped slots 16 can accumulate to provide vertical displacement for relieving the stress generated as the vertical probe 10 contacts the device under test (not shown in the drawings). Preferably, the included angle between the two edges of the pie-shaped slots 16 is between 90 and 180 degrees, and the pie-shaped slots 16 are positioned on one side of the linear body 12 such that the vertical probe 10 can bend to the side to relieve the stress to one side of the probe body.

Figure 2:
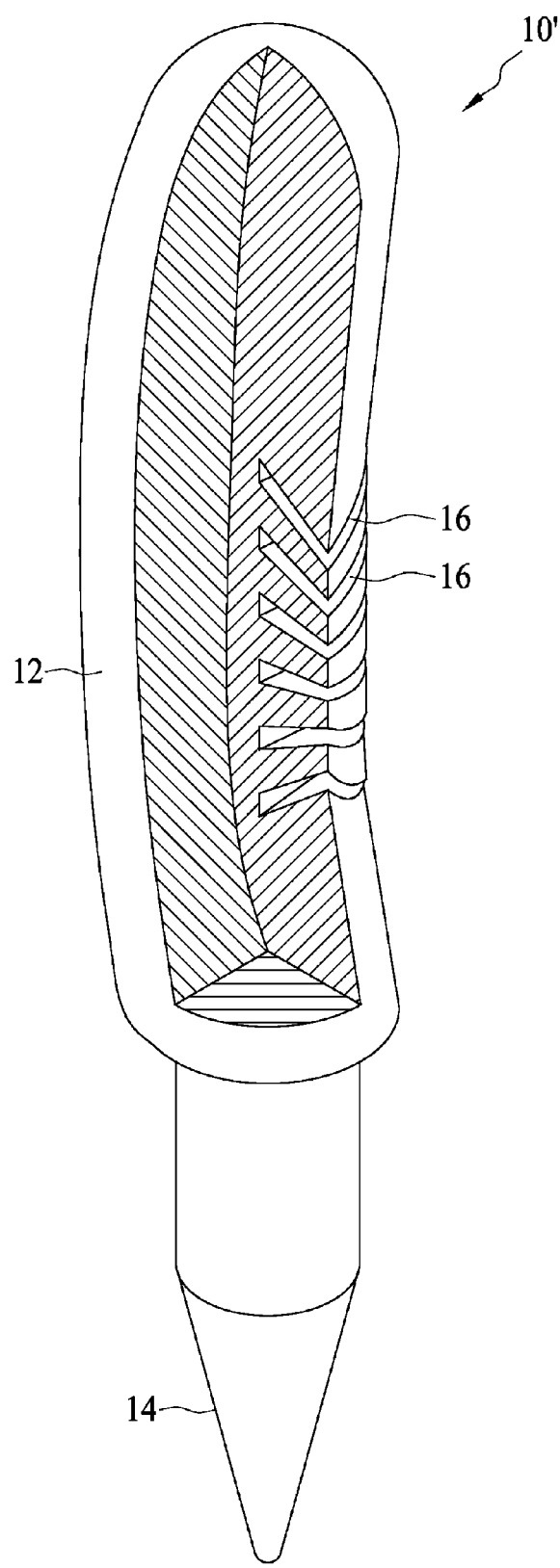
FIG. 2 illustrates a three-dimensional view of a vertical probe according to another embodiment of the present invention.

FIG. 2 illustrates a three-dimensional view of a deformed vertical probe 10' according to one embodiment of the present invention. The probe body 12 is shown to have bent and the slots 16 are showed to have reduced spacing due to the compression of the probe body 12 towards the slot direction. In particular, the pressure of the tip portion 14 on a contact pad can be decreased by increasing the numbers of the slots 16 with the same displacement distance. On the contrary, by reducing the number of the slots 16, the pressure on of the probe tip 14 on the contact pad will be increased.

Figure 3:
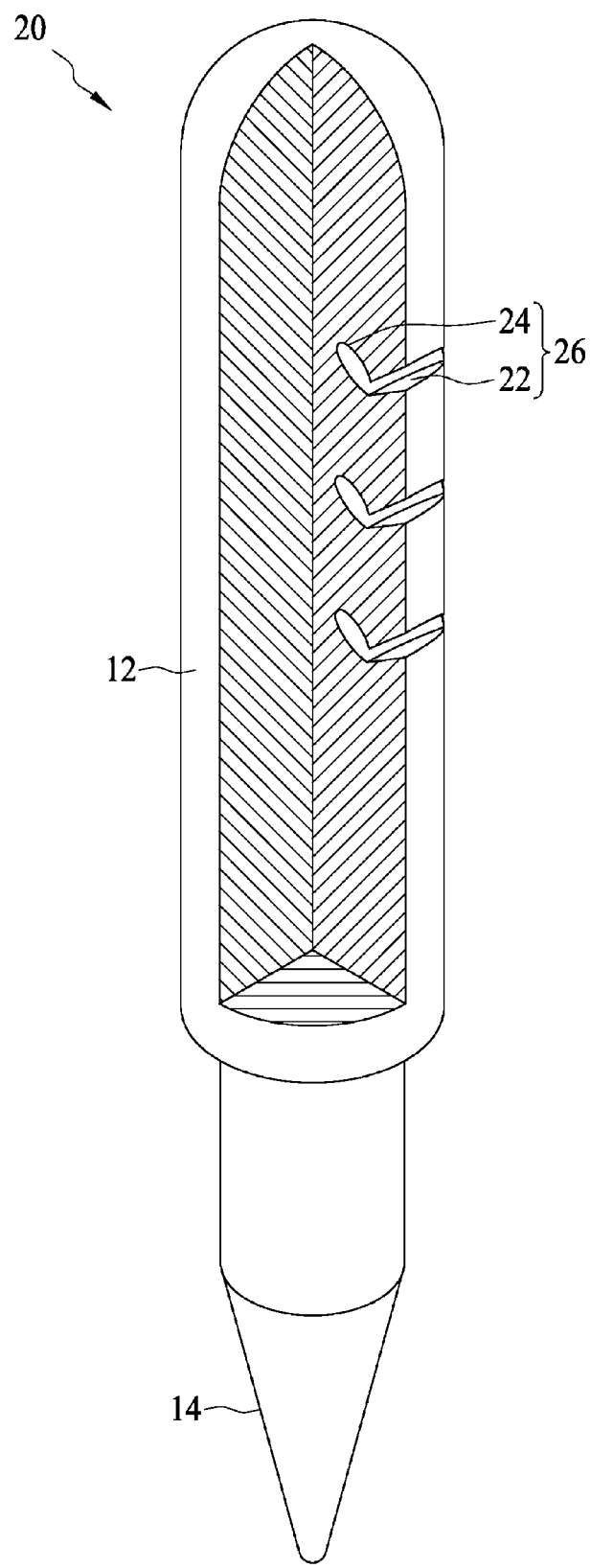
FIG. 3 illustrates a deformed view of the vertical probe due to vertical displacement of the probe tip according to one embodiment of the present invention.

FIG. 3 illustrates a three-dimensional view of a vertical probe 20 according to another embodiment of the present invention. Compared with the vertical probe 10 having horizontal slots 16 in FIG. 1, the vertical probe 20 comprises several slots 26 including an open portion 22 and a depressed portion 24 connected to the open portion 22. In particular, the open portion 22 and the depressed portion 24 connect at an interface (corner portion) having a smaller width than the open portion 22 and the depressed portion 24. When the vertical probe 20 bends to relieve the stress as the tip portion 14 contacts the device under test, the corner portion will contact the bottom surface of the slots 26 to form a current path to reduce the resistance of the vertical probe 20.

Figure 4:
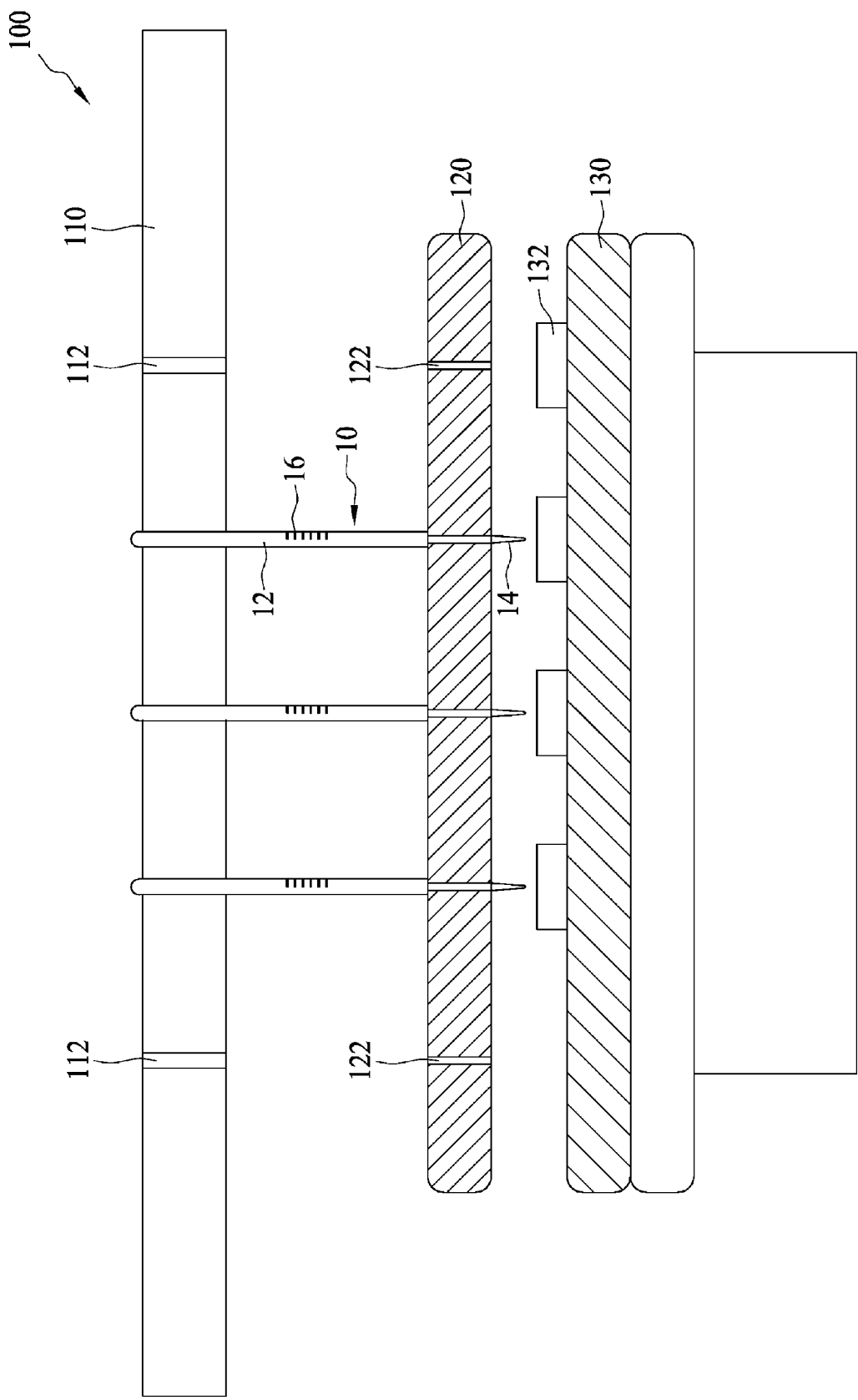
FIG. 4 illustrates a probe card for integrated circuit devices according to one embodiment of the present invention.

FIG. 4 illustrates a probe card 100 for integrated circuit devices according to one embodiment of the present invention. The probe card 100 comprises an upper guiding plate 110 having a plurality of fastening holes 112, a bottom guiding plate 120 having a plurality of guiding holes 122 and a plurality of vertical probes 10 positioned in the guiding holes 122. The upper guiding plate 110 can be a print circuit board. Since the vertical probe 10 is linear, the guiding holes 122 can be positioned substantially right below the fastening holes 112 without deviation. Preferably, the slots 16 of the vertical probes 10 face the same direction as shown on the right side of FIG. 3, such that the vertical probes 10 bend to the same side to relieve the stress without contacting each other and causing short circuits or collisions as the tip portion 14 contact the pad 132 of the integrated circuit device 130 under test.

Figure 5:
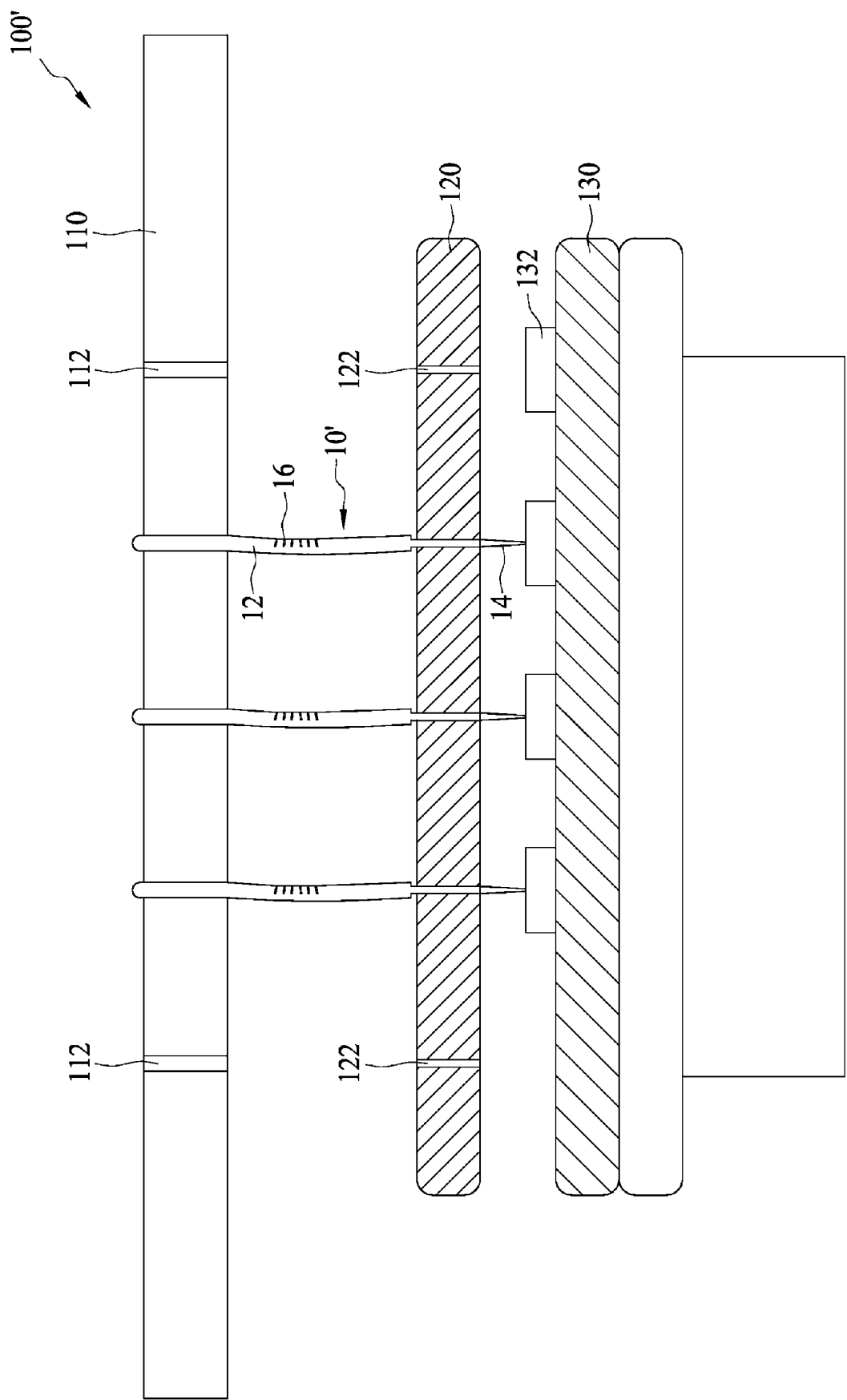
FIG. 5 illustrates a probe card with plurality of bent probes due to vertical displacement as the embodiment contacts the integrated circuit devices build in the silicon wafer.

One problem with the conventional vertical probe arises as the number of the probe increases the bottom guide plate will sustain increasing probe force from the bend probe. For example, in the case of the probe card having five thousand probes, a force of 1 gram exerted by each probe will result in a force of five kilogram exerted on the bottom guide plate. In contrast, the high probe force on the bottom guide plate 120 is eliminated as the probe body 12 of the vertical probe 10 does not need to exert any pressure on the bottom guide plate 120 as in conventional vertical probe card. This enables the planarity of the bottom guide plate 120 within high tolerance and with minimal deformation FIG. 5 illustrates a probe card 100' for integrated circuit devices according to another embodiment of the present invention. The probe card 100' has a plurality of bent probes 10 in contact with integrated circuits devices 130. The bent probe body 12 showed minimal horizontal displacement and therefore reducing the risk of contacting one another during electrical tests.

The conventional cantilever probe cannot be applied to the integrated circuit device with high-density pads since it needs a lateral space to receive the lateral cantilever. In contrast, the vertical probes 10, 20 of the present application does not need the lateral space, and can be applied to the integrated circuit device with high-density pads.

In addition, the conventional vertical probe uses the deformation of the probe body itself to provide the vertical displacement for relieving the stress generated as the probe contacts the device under test, but the adjacent probes may contact each other and cause short circuits or collisions if the deformation of the probe body is too large. In contrast, the vertical probes 10, 20 of the present application use the slots 16, 26 to relieve the stress and the slots 16, 26 of the vertical probes 10, 20 can bend to the same side to prevent the vertical probes 10, 20 from contacting each other and causing short circuits or collisions.

The above-described embodiments of the present invention are intended to be illustrative only. Numerous alternative embodiments may be devised by those skilled in the art without departing from the scope of the following claims.

What is claimed is:

1. A vertical probe, comprising:
   a linear body extending along a direction substantially without a curve when the vertical probe is not under compression, wherein the width of the linear body is substantially constant;

a tip portion connected to one side of the linear body, wherein the width of the tip portion is smaller than the width of the linear body;

wherein the vertical probe comprises a plurality of slots;

wherein the linear body bends with respect to the slots when the vertical probe is under compression and restores its unbent configuration when the vertical probe is not under compression;

wherein each slot is perpendicular to the surface of the linear body, and the linear body bends with respect to the slots substantially without causing a lateral movement of the tip portion;

wherein the slots comprise apertures; and wherein the slots are positioned on the linear body in parallel, and the apertures in the slots face the same direction.

2. The vertical probe of claim 1, wherein the slots are positioned on one side of the linear body.

3. The vertical probe of claim 1, wherein the linear body is cylindrical.

4. The vertical probe of claim 3, wherein the slots are pie-shaped.

5. The vertical probe of claim 4, wherein an included angle between two edges of each of the pie-shaped slots is between 90 and 180 degrees.

6. The vertical probe of claim 1, wherein each of the slots includes an open portion and a depressed portion connected to the open portion.

7. The vertical probe of claim 6, wherein the open portion and the depressed portion connect at an interface having a smaller width than the open portion and the depressed portion.

8. A probe card for integrated circuit devices, comprising:
an upper guiding plate having a plurality of fastening holes;
a bottom guiding plate having a plurality of guiding holes;
a plurality of vertical probes including:
  a linear body positioned in the guiding holes and extending along a direction substantially perpendicular to a device under test without a curve when the vertical probe is not under compression, wherein the width of the linear body is substantially constant;
  a tip portion connected to one side of the linear body, wherein the width of the tip portion is smaller than the width of the linear body;

wherein the vertical probe comprises a plurality of slots;

wherein the linear body bends with respect to the slots when the vertical probe is under compression and restores its unbent configuration when the vertical probe is not under compression;

wherein each slot is perpendicular to the surface of the linear body, and the linear body bends with respect to the slots substantially without causing a lateral movement of the tip portion;

wherein the slots comprise apertures; and wherein the slots are positioned on the linear body in parallel, and the apertures in the slots face the same direction.

9. The probe card for integrated circuit devices of claim 8, wherein the slots are positioned on one side of the linear body.

10. The probe card for integrated circuit devices of claim 8, wherein the linear body is cylindrical.

11. The probe card for integrated circuit devices of claim 10, wherein the slots are pie-shaped.

12. The probe card for integrated circuit devices of claim 11, wherein an included angle between two edges of each of the pie-shaped slots is between 90 and 180 degrees.

13. The probe card for integrated circuit devices of claim 8, wherein the slot includes an open portion and a depressed portion connected to the open portion.

14. The probe card for integrated circuit devices of claim 13, wherein the open portion and the depressed portion connect at an interface having a smaller width than the open portion and the depressed portion.

15. The probe card for integrated circuit devices of claim 8, wherein the guiding holes are positioned below the fastening holes.

16. The probe card for integrated circuit devices of claim 8, wherein the upper guiding plate is a circuit board.

17. The probe card for integrated circuit devices of claim 8, wherein the width of the guiding hole is larger than that of the tip portion, and the width of the guiding hole is smaller than that of the linear body.

* * * * *